(12) United States Patent
Bormashenko et al.

(10) Patent No.: US 9,587,304 B2
(45) Date of Patent: Mar. 7, 2017

(54) SUPERHYDROPHOBIC NANOTEXTURED POLYMER AND METAL SURFACES

(75) Inventors: Edward Bormashenko, Ariel (IL); Yelena Bormashenko, Ariel (IL); Gene Vaiman, Haifa (IL); Tamir Stein, Moshav Gittit (IL)

(73) Assignee: Ariel-University Research and Development Company Ltd., Ariel (IL)

( * ) Notice: Subject to any disclaimer, the term of this patent is extended or adjusted under 35 U.S.C. 154(b) by 789 days.

(21) Appl. No.: 12/441,615

(22) PCT Filed: Sep. 20, 2007

(86) PCT No.: PCT/IL2007/001163
§ 371 (c)(1),
(2), (4) Date: Mar. 17, 2009

(87) PCT Pub. No.: WO2008/035347
PCT Pub. Date: Mar. 27, 2008

(65) Prior Publication Data
US 2010/0021692 A1    Jan. 28, 2010

(30) Foreign Application Priority Data
Sep. 21, 2006  (IL) .......................... 178239

(51) Int. Cl.
*B05D 3/12* (2006.01)
*C23C 14/20* (2006.01)
*B05D 1/42* (2006.01)
*B05D 5/08* (2006.01)
*B05D 5/06* (2006.01)

(52) U.S. Cl.
CPC .............. *C23C 14/205* (2013.01); *B05D 1/42* (2013.01); *B05D 5/08* (2013.01); *B05D 5/067* (2013.01); *Y10T 428/24612* (2015.01)

(58) Field of Classification Search
CPC .................................................. C23C 14/205
USPC ............................................................ 427/355
See application file for complete search history.

(56) References Cited

U.S. PATENT DOCUMENTS 5,709,943 A  * 1/1998 Coleman et al. ............. 428/378
6,068,911 A    5/2000 Shouji et al.
6,641,767 B2 * 11/2003 Zhang et al. ................. 264/220
(Continued)

FOREIGN PATENT DOCUMENTS

DE       19917366 A1    10/2000
DE       101 18 346 A1  10/2002
(Continued)

OTHER PUBLICATIONS

Klein et al., Producing Super-Hydrophobic Surfaces with Nano-Silica Spheres, p. 1-12.*
(Continued)

*Primary Examiner* — Tabatha Penny

(57) ABSTRACT

A method of manufacturing a multiscale (hierarchical) superhydrophobic surface is provided. The method includes texturing a polymer surface at three size scales, in a fractal-like or pseudo-fractal-like manner, the lowest scale being nanoscale and the highest microscale. The hydrophobic polymer surface may be converted to hydrophobic metal surface by subsequent deposition of a metal layer onto the polymer surface.

1 Claim, 4 Drawing Sheets

(56) References Cited

U.S. PATENT DOCUMENTS

| | | | |
|---|---|---|---|
| 6,649,266 B1* | 11/2003 | Gross et al. | 428/410 |
| 6,855,371 B2* | 2/2005 | Gier et al. | 427/277 |
| 2002/0016433 A1* | 2/2002 | Keller et al. | 528/10 |
| 2002/0142150 A1* | 10/2002 | Baumann et al. | 428/328 |
| 2002/0150723 A1* | 10/2002 | Oles et al. | 428/143 |
| 2004/0047997 A1* | 3/2004 | Keller et al. | 427/402 |
| 2005/0008876 A1 | 1/2005 | Teranishi | |
| 2006/0147829 A1 | 7/2006 | Huang et al. | |
| 2008/0063797 A1 | 3/2008 | Huang | |

FOREIGN PATENT DOCUMENTS

| | | | |
|---|---|---|---|
| DE | 10129116 A1 | 12/2002 | |
| EP | 1 249 468 A2 | 10/2002 | |
| EP | 1 726 609 A1 | 11/2006 | |
| WO | WO 2008/035347 | 3/2008 | |

OTHER PUBLICATIONS

Onda, Super-Water-Repellent Fractal Surfaces, Langmuir, May 1, 1996, vol. 12 No. 9, p. 2125-2127.*

De Gennes et al., "Capillarity and Wetting Phenomena", 2003, Springer, Berlin.

Lafuma et al., "Superhydrophobic States", Nature Materials, Jul. 2003, pp. 457-460, vol. 2, Nature Publishing Group, UK.

Gao et al., "The 'Lotus Effect' Explained: Two Reasons Why Two Length Scales of Topography are Important", Langmuir, Mar. 2006, pp. 2966-2967, vol. 22, American Chemical Society, USA.

Vogelaar et al., "Superhydrophobic Surfaces Having Two-Fold Adjustable Roughness Prepared in a Single Step", Langmuir, Feb. 2006, pp. 3125-3130, vol. 22, American Chemical Society, USA.

Bico et al., "Wetting of Textured Surfaces", Colloids and Surfaces A, 2002, pp. 41-46, vol. 206, Elsevier Science B. V., The Netherlands.

He et al., "Contact Angle Hysteresis on Rough Hydrophobic Surfaces", Colloids and Surfaces A, 2004, pp. 101-104, vol. 248, Elsevier Science B. V., The Netherlands.

Jeong et al., "Nanoengineered Multiscale Hierarchical Structures with Tailored Wetting Properties", Langmuir, Jan. 2006, pp. 1640-1645, vol. 22, American Chemical Society, USA.

Abdelsalam et al., "Wetting of Regularly Structured Gold Surfaces", Langmuir, Jan. 2005; pp. 1753-1757, vol. 21, American Chemical Society, USA.

Herminghaus, "Roughness-induced Non-wetting", Europhysics Letters, 2000, pp. 165-170, vol. 52, EDP Sciences, France.

Barthlott et al., "Purity of the Sacred Lotus, or Escape from Contamination in Biological Surfaces", Planta, 1997, pp. 1-8, vol. 202, Springer-Verlag, Germany.

Oner et al., "Ultrahydrophobic Surfaces. Effects of Topography Length Scales on Wettability", Langmuir, 2000, pp. 7777-7782, vol. 16, American Chemical Society, USA.

Yoshimitsu et al., "Effects of Surface Structure on the Hydrophobicity and Sliding Behavior of Water Droplets", Langmuir, 2002, pp. 5818-5822, vol. 18, American Chemical Society, USA.

Office Action from Israeli PTO in corresponding application No. 178239 dated Dec. 13, 2009.

Fengxiang Zhang et al, Anisotropic Wettability on Imprinted Hierarchical Structures, Langmuir 2007, 23, 7793-7798.

Lichao Gao et al, The "Lotus Effect" Explained: Two Reasons Why Two Length Scales of Topography Are Important, Langmuir 2006, 22, 2966-2967.

Neelesh A. Patankar, Mimicking the Lotus Effect: Influence of Double Roughness Structures and Slender Pillars, Langmuir 2004, 20, 8209-8213.

Hoon Eui Jeong et al, Nanoengineered Multiscale Hierarchical Structures with Tailored Wetting Properties, Langmuir 2006, 22, 1640-1645.

Mamdouh E. Abdelsalam et al, Wetting of Regularly Structured Gold Surfaces, Langmuir 2005, 21, 1753-1757.

Shutao Wang et al, Definition of Superhydrophobic States, Adv. Mater. 2007, 19, 3423-3424.

Abraham Marmur, Wetting on Hydrophobic Rough Surfaces: To Be Heterogeneous or Not to Be?, Langmuir 2003, 19, 8343-8348.

N. J. Shirtcliff et al, Wetting and Wetting Transitions on Copper-Based Super-Hydrophobic Surfaces, Langmuir 2005, 21, 937-943.

Zen Yoshimitsu et al, Effects of Surface Structure on the Hydrophobicity and Sliding Behavior of Water Droplets, Langmuir 2002, 18, 5818-5822.

Satoshi Shibuichi et al, Super Water-Repellent Surfaces Resulting from Fractal Structure, J. Phys. Chem 1996, 100, 19512-19517.

Office Action dated Aug. 23, 2010 issued in corresponding European Patent Application No. 07 827 139.2.

Response to Office Action submitted Nov. 9, 2010 in corresponding European Patent Application No. 07 827 139.2.

Arthurs, Now That's how to wear your Jimmy Choos in the rain . . . Coating that Repels water could revolutionise fashion world, Daily Mail Online, Nov. 16, 2011, Associated Newpapers Ltd, United Kingdom.

Communication Pursuant to Article 94(3) EPC Dated Dec. 13, 2012 From the European Patent Office Re. Application No. 07827139.2.

Communication Pursuant to Article 94(3) EPC Dated Nov. 17, 2014 From the European Patent Office Re. Application No. 07827139.2.

Communication Pursuant to Article 94(3) EPC Dated Aug. 23, 2010 From the European Patent Office Re. Application No. 07827139.2.

International Preliminary Report on Patentability Dated Mar. 31, 2009 From the International Bureau of WIPO Re. Application No. PCT/IL2007/001163.

International Search Report and the Written Opinion Dated Mar. 17, 2009 From the International Searching Authority Re. Application No. PCT/IL2007/001163.

Shibuichi et al. "Super Water-Repellent Surfaces Resulting From Fractal Structure", The Journal of Phsyical Chemistry, XP002517562, 100(50): 19512-19517, 1996.

* cited by examiner

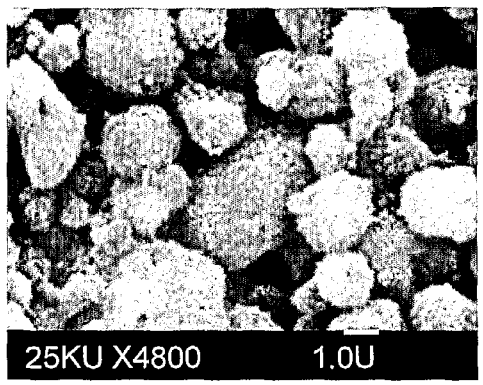 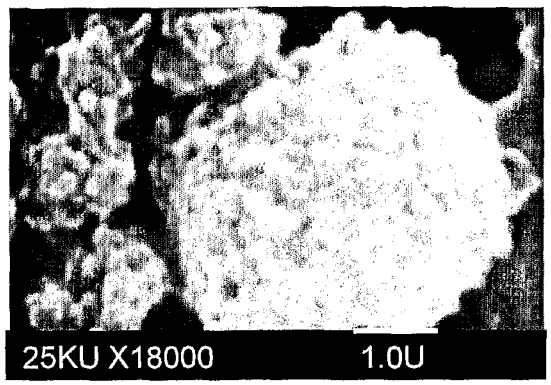
Fig. 3a　　　　　Fig. 3b
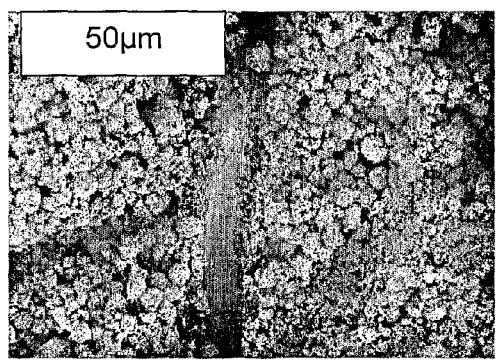 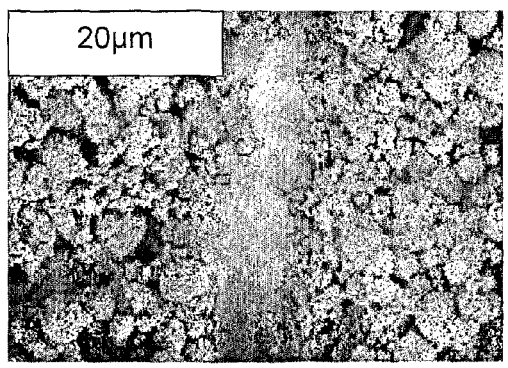
Fig. 4a　　　　　Fig. 4b

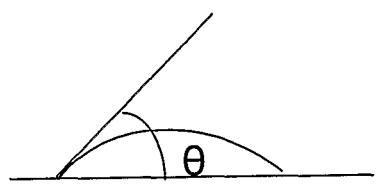
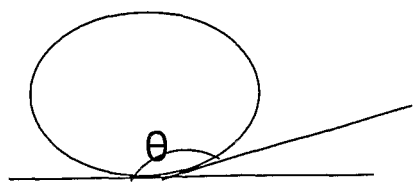
Fig. 5a
Fig. 5b
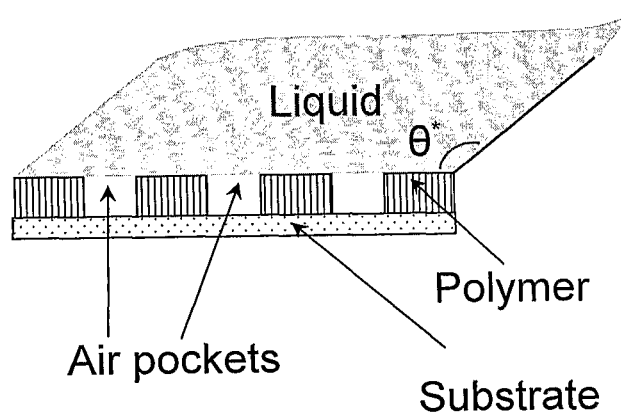
Fig. 5c

SUPERHYDROPHOBIC NANOTEXTURED POLYMER AND METAL SURFACES

FIELD OF THE INVENTION

The present invention relates to superhydrophobic polymer or metal surfaces, textured at three size scales, in a fractal-like or pseudo-fractal-like manner, the lowest scale being nanoscale.

BACKGROUND OF THE INVENTION

Although the wetting of textured surfaces have been theoretically studied, their practical utilization is disproportionately rare, and the lack of reproducible experimental data in the field is conspicuous [de Gennes P. G. et al.: Capillarity and Wetting Phenomena, Springer, Berlin, 2003; Lafuma, A.& Quéré, D.: Nature Materials 2 (2003) 457-60].

Highly hydrophobic surfaces are needed in many important applications, such as in manufacturing water-repellant textile, in constructing fuel cells, in batteries for membranes non-wetted under storage, desalination membranes, antenna coatings, etc. The phenomenon of superhydrophobi-city, i.e. the situation when apparent contact angle (ACA) becomes close to 180°, was reported recently by different groups [Gao, L. & McCarthy T. J.: Langmuir 22 (2006) 2966-7; Vogelaar L. et al.: Langmuir 22 (2006) 3125-30; Bico J. et al.: Colloids and Surfaces A 206 (2002) 41-46]. Various sophisticated techniques, including UV, soft lithography [He B. et al.: Colloids and Surfaces A 248 (2004) 101-4], temperature directed capillary molding [Jeong H. E. et al.: Langmuir 22 (2006) 1640-5], and various materials, including perfluoroacrylates [Lafuma A. & Quéré D.: Nature Materials 2 (2003) 457-60], and alkylketene dimers [Shibuichi A. et al.: J. Phys. Chem. 100 (1996) 19512-7] were applied for manufacturing super water-repellent surfaces. Superhydrophobic surfaces are also found in nature [Herminghaus S.: Europhysics Letters 52 (2000) 165-70; Barthlott W. & Neinhuis C.: Planta 202 (1997) 1-8]. The biological expedience of the phenomenon, called the lotus effect, consists in the possibility of self-cleaning of plant leaves due to the rolling of drops without water spreading on the leaf surface.

Practical needs of hydrophobic surfaces are not satisfied, particularly in cases when the surface should comprise objects made of inherently hydrophilic materials. In spite of significant experimental and theoretical efforts, a reproducible inexpensive manufacture of superhydrophobic surfaces is not available. It is therefore an object of this invention to provide a method of forming a superhydrophobic surface, applicable on a variety of materials. Metallic surfaces are well-known as "high-energy interfaces", for which the chemical binding is of order of 1 eV, and on which nearly every liquid spreads [de Gennes P. G. et al.: Capillarity and Wetting Phenomena, Springer, Berlin, 2003.] Increasing hydrophobicity on metallic surfaces can be achieved by applying a monolayer of dodecane thiol on textured metallic surfaces [Öner D. & McCarthy T. J.: Langmuir 16 (2000) 7777-82; Yoshimitsu Z. et al.: Langmuir 18 (2002) 5818-22; Abdelsalam M. E. et al.: Langmuir 21 (2005) 1753-7]. However, the applied layer is not always stable, and some applications do not allow applying such layers of chemicals. It is therefore another object of this invention to provide a metal surface possessing hydrophobicity. More generally, another object of the invention is to provide a suitable method of producing hydrophobic surfaces made of relatively hydrophilic materials.

Other objects and advantages of present invention will appear as description proceeds.

SUMMARY OF THE INVENTION

The invention provides a method of manufacturing a superhydrophobic multiscale (hierarchical) polymer surface or superhydrophobic metal surface, comprising i) providing a base substrate and a polymeric material in a form of micro- or nano-metrically scaled particles; ii) forming a layer of said polymeric material on said substrate, said layer having a bottom surface attached to said substrate base, and an upper surface, wherein the polymeric material in said layer is structured at two different size scales, the lower scale being a nanoscale (a first size scale); the larger (second) scale is 0.5-50 µm. iii) further structuring said polymeric material at a third size scale by forming indentations on said upper surface, wherein an average distance between adjacent indentations is from 20 to 200 µm, thereby obtaining a water-repellent surface comprising fractal-like or pseudo-fractal-like texturing at three different size scales (a first, a second, and a third size scale); and, if wishing to obtain a metal surface, further iv) depositing a metal layer onto said upper surface; thereby obtaining superhydrophobic polymer or metal surface. Said various size scales relate to the texture, or by other words, to the topographical elements and porosity parameters, including elevations and depressions on the surface and mass distribution in the volume, of said surface and of the layer making said surface. Said polymeric layer may be made of more polymer types, and may contain other material being embedded in the polymer and contributing to the topography, such as, for example, non-polymeric fibers or glass beads dispersed in the polymeric matrix, which matrix by itself may comprise more phases or components. All the parts are arranged in regularly repeated areas of higher and lower mass density, wherein there are three repeat-periods in this pseudoperiodic pattern. A material yielding the surface of the invention comprises three types of regular patterns comprising different space spans, and these patterns may be achieved, e.g., by structuring one polymeric material or by using more materials in a composite structure. The mass density measured along a line going through the material, thus, oscillates, in a fractal-like manner, on three different period levels. The invention relates to a method of manufacturing a superhydrophobic surface, and to an article comprising a polymer layer exhibiting such superhydrophobic surface, structured at three different size scales, in a fractal-like manner. When using the term nanoscale in relation with said first size scale, what is intended is a range comprising from nanometers to micrometers, namely from several nanometers to several thousands nanometers. Preferably, the first size scale ranges from about 0.1 to 2 µm, the second size scale ranges from 2-20 µm, and the third size scale ranges from 20-200 µm. Said superhydrophobic surface preferably exhibits apparent contact angle of at least 150°. Said substrate is an organic material or a non-organic material. The substrate may be, for example, selected from glass, polymer, ceramics, metal, and textile. The structuring at said first size scale may be determined by particles present in the layer of said polymeric material, which particles have an average size of from about 0.1 to 2 µm, and the structuring at said second size scale may be determined by aggregates of said particles, which aggregates have an average size of from 2 to 20 µm. The structuring at said third size scale is preferably achieved by pressing into the upper surface of said layer indentations whose average distance from each other is from 20 to 200 µm. The indentations may be arranged in an array of approximately parallel channels, or in a plane network of depressions. The arrangement of channels also may be random. The width and depth of said indentations are preferably independently from about 5 to about 100 μm. In a preferred embodiment, the method of manufacturing a superhydrophobic polymer surface according to the invention comprises i) providing beads of a first polymer having an average size of 0.1-2 μm; ii) providing a second polymer; iii) providing a solvent which dissolves that second polymer but not said first polymer; iv) preparing a solution of said second polymer in said solvent, admixing said beads into the solution, and layering the suspension on a base substrate; v) evaporating said solvent, thereby obtaining said layer of polymeric material comprising bead aggregates of from 2 to 20 μm; and vi) impressing a web of indentations on the upper surface of said layer, wherein the width and the depth of the indentations are independently from 5 to 100 μm. There are many known polymers, and according to desired applications of the hydrophobic surfaces, tables teaching the polymer properties may be consulted. In a preferred embodiment, the method of manufacturing a superhydrophobic metal surface according to the invention comprises i) providing beads of a first polymer having an average size of 0.1-2 μm; ii) providing a second polymer; iii) providing a solvent which dissolves that second polymer but not said first polymer; iv) preparing a solution of said second polymer in said solvent, admixing said beads into the solution, and layering the suspension on a base substrate; v) evaporating said solvent, thereby obtaining said layer of polymeric material comprising bead aggregates of from 2 to 20 μm; vi) impressing a web of indentations on the upper surface of said layer, wherein the width and the depth of the indentations are independently from 5 to 100 μm; and vii) coating the indented surface with a metal film. Said metal film may be prepared by sputtering gold atoms in argon atmosphere. A skilled person will be able to modify the method and coat the hydrophobic polymeric surface by other material desired for certain applications, wherein such coating may include known methods for applying thin layers, such as depositing, sputtering, spraying, immersing, etc. Said first polymer may be, for example, polyvinylidene fluoride (PVDF) or polytetrafluoroethylene (PTFE), said second polymer may be a polycarbonate based polymer, and said solvent may be a chlorinated solvent.

The invention provides articles comprising a superhydrophobic surface. In a preferred embodiment, an article according to the invention comprises a polymer layer exhibiting a superhydrophobic surface structured at three different size scales, in a fractal-like manner, the first size scale ranging from less than 0.1 μm to 2 μm, the second size scale ranging from 2-20 μm, and the third size scale ranging from 20-200 μm. When relating to an article comprising a hydrophobic surface, an article is meant whose total surface comprises at least a part that has the mentioned properties. For example, a piece of textile whose one side is hydrophobic is intended to be included. In a preferred embodiment of the invention, the article exhibiting superhydrophobic surface comprises a metal coating having a width of from 0.01 to 0.1 μm and being deposited on said polymer layer. Such metal-surface article, while acquiring various properties of fully metal articles, has nearly the same hydrophobicity as the plastic article from which it was obtained by metal coating. Thus, the invention includes articles having at least one superhydrophobic polymer or metal surface, i.e., comprising at least a part of the total surface which was processed according to the invention. Thus, in a preferred embodiment of the invention, the article comprises a metal coating being deposited on a polymer layer. An article according to the invention has at least one superhydrophobic polymer or metal surface. Preferably, said superhydrophobic surface exhibits apparent contact angle of at least 150°. Said layer is deposited on a base substrate that may be selected, for example, from glass, polymer, metal, and textile. Said first size scale may be determined by particles present in the layer of said polymeric material, the particles having an average size of from about 0.1 to 2 μm, said second size scale may be determined by aggregates of said particles, the aggregates having an average size of from 2 to 20 μm. Said third size scale is preferably achieved by pressing into the upper surface of said layer indentations, wherein the average distance between adjacent channels is from 20 to 200 μm. The indentations may be arrayed as parallel channels. The indentations may be arrayed as a plane network of depressions whose centers may form, e.g., a square or triangle network. The width and depth of said indentations are preferably independently from about 5 to about 100 μm, preferably less than 20 μm. At least one of said three size scales is determined by the presence of structure element selected from particles, fibers, and particle aggregates, wherein the material of said structure element is selected from natural or synthetic polymers, and inorganic materials. The size of said size scale results from dimensions of said particles, fibers, or aggregates, or from average distances between adjacent particles, fibers, aggregates, or other building units. Thus, the size of said size scales may result both from the dimensions and from the spatial distribution of said units. Said polymer layer may be a composite material. In a preferred embodiment, an article according to the invention comprises a surface exhibiting apparent contact angle of at least 150°. Said article may be selected from, but not being limited to, water-repellant textile or an item made thereof, non-wetted membranes, antenna coatings, parts of fuel cells, parts of batteries, and parts of desalination devices.

BRIEF DESCRIPTION OF THE DRAWINGS

The above and other characteristics and advantages of the invention will be more readily apparent through the following examples, and with reference to the appended drawings, wherein:

FIG. 3. shows SEM images of the surface relief comprising PDVF bead-aggregates (Relief A), FIG. 3a shows the aggregates comprising PDVF nanobeads at 4800× magnification, FIG. 3b shows mainly a single aggregate of PDVF nano-beads at 18000× magnification;

FIG. 4. shows SEM images of the random fractal-like interface composed of PVDF beads aggregates deposited on PE substrates (relief B), FIG. 4a shows lower magnification, and FIG. 4b shows higher magnification detailing a channel surrounded with PVDF beads aggregates; and FIG. 5. is a scheme showing a drop of water on a flat surface, and illustrating how the local contact angle θ is defined, FIG. 5a showing a hydrophilic surface, FIG. 5b a hydrophobic surface, and FIG. 5c showing a drop of water deposited on the textured surface and illustrating how the apparent contact angle θ' is defined.

DETAILED DESCRIPTION OF THE INVENTION

It has now been found that certain purely structural features confer to an otherwise hydrophilic material a strongly hydrophobic character. For example, when structuring a polymeric material at three different size scales in a fractal-like manner, a surface was obtained that exhibited an apparent contact angle (ACA) of more than 150°; the lowest of said three levels was represented by 0.1 µm polymer beads, the second level being formed by 10 µm aggregates of said beads, and the highest level was created by channels carved in 100 µm distances into the deposit of said polymer deposited on a smooth underlying matrix.

Figure 1A:
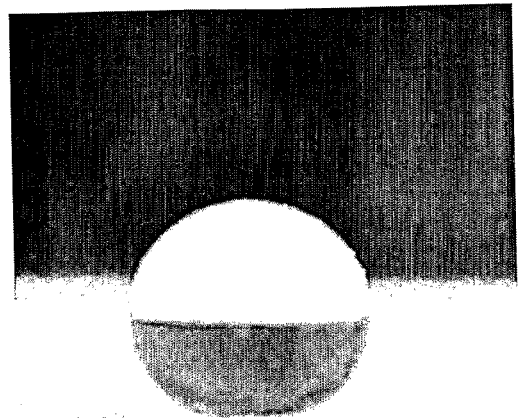
FIG. 1. is a photograph of droplets deposited on the polymer fractal-like relief (FIG. 1a) and on a gold-coated relief (FIG. 1b)
Figure 1B:
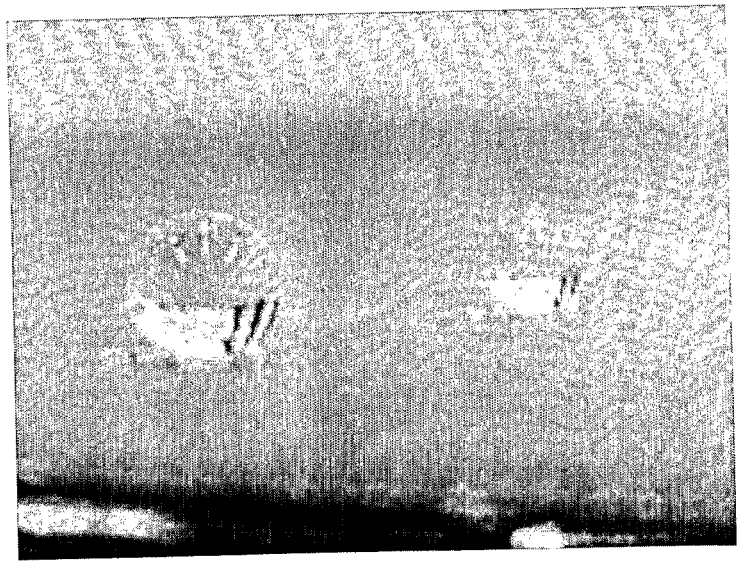

In one embodiment of the invention, a superhydrophobic surface was created by depositing polyvinylidene fluoride (PVDF) particles of industrial grade onto a polyethylene or polypropylene substrate. The manner of depositing was such that particles of PVDF, about 0.1 µm in diameter, were layered onto said substrate while forming aggregates of about 10 µm in size, followed by carving approximately equidistant channels into the aggregate layer, the adjacent channels being about 100 µm from each other, so forming a three-level structure in a fractal-like manner. What was surprising was that PVDF is inherently a hydrophilic material, showing an ACA of about 75°, when measured on flat, unstructured, samples. However, when the same PVDF was structured according to the invention, and comprised nano-sized beads, its ACA increased up to 160° (see FIG. 1a).

The apparent contact angle (ACA) is a measure of hydrophobicity, and its meaning is illustrated in FIG. 5c. When a water drop is placed on a plane made of the measured material, the tangent to the water surface is taken at the contact point with the plane, and the angle formed by tangent and the plane (the angle that encompasses the drop) is measured. It can be seen, that the higher the ACA, the higher hydrophobicity of the plane surface is, the theoretically highest value being 180°.

Figure 2A:
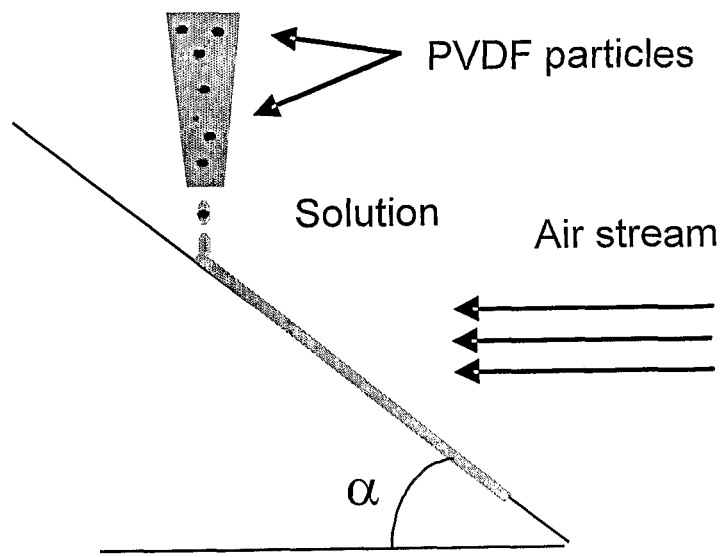
FIG. 2. is a scheme illustrating the manufacture of highly developed surfaces.

When using the scheme of FIG. 2a of producing the said superhydrophobic surface from solution, the Relief A was obtained comprising PVDF nanobeads of 0.1 µm (100 nanometers) in diameter which were assembled in aggregates of about 10 µm, as shown in FIG. 3. Applying the powder technique, illustrated in FIG. 2b, led to the further structured Relief B with still higher structural level in its pseudo-fractal system, i.e. with approximately linear and roughly equidistant channels. The distance between channels was about 100 µm. Scanning-electron-micrographs (SEM) of Relief B is shown in FIG. 4. The measured ACA values for Relief A was about 95°, and for Relief B about 160°. The structuring at said third level may be effected by known imprinting technique, or by modifying such technique.

The obtained superhydrophobic surface was subsequently coated with a thin layer of gold, providing a metal surface. When measuring hydrophobicity of the produced metal surface, a surprising result was obtained—the ACA value was 150°. Whereas a smooth golden plane shows ACA of about 40°, the same metal material textured to copy the relief of the underlying plastic layer exhibited superhydrophobic behavior, demonstrating that texturing a surface in the fractal-like manner according to the invention may confer water-repellent properties to any materials that can be deposited onto an underlying textured surface, provided that the unevenness of the lowest size scale be not smoothed out.

While a smooth surface of a plastic material yielded ACA of about 75°, a structured, pseudo-fractal surface of Relief A, comprising two structuring levels, exhibited by about 20° higher ACA, and when adding a third structuring level, a further increase by 50-60° more, depending on the material eventually deposited on the underlying plastic textured layer, was observed—falling not too far from the theoretical maximum of 180°.

The invention provides a simple and inexpensive method of producing superhydrophobic surfaces, comprising structuring polymer material simultaneously on more size levels, and layering the multi-textured material on a desired substrate. In a preferred embodiment of the invention, a superhydrophobic surface is formed, comprising hot pressing of PVDF powder on polyethylene substrate. The obtained partially ordered pseudo-fractal surface shows super-hydrophobicity with the apparent contact angle as high as 160°.

The invention enables to manufacture superhydrophobic surfaces from industrial grade polymer materials. In one embodiment, the surface comprises partly disordered pseudo-fractal arrays of PVDF globules. A superhydrophobic metallic surface can be produced, using the polymer surface as a template.

In a preferred embodiment of the invention, a polymeric multi-structured superhydrophobic surface is coated with a metal (for example gold, silver, aluminium, titanium, molybdenum), the measured apparent contact angle for gold, for example, being 150°, but other hydrophilic metallic layers may be employed. The method of the invention, thus, enables, in one aspect, to confer a high degree of hydrophobicity to a metal surface. Thus, the invention provides a method for converting inherently wettable materials to superhydrophobic ones.

The invention will be further described and illustrated in the following examples.

EXAMPLES

Materials and Methods

Polyvinylidene fluoride nano-beads were purchased from Aldrich, molecular weight $M_w$=534 000, $T_g$=38.0° C., density $\rho$=1.74 g/cm$^3$. The average diameter of particles was established as 130 nm. Polycarbonate (PC) Lexan 141 was purchased from GE Plastics. Chloroform (pure for analysis) was obtained from Karlo Erba Reagenti.

Apparent contact angle (ACA) was measure using the goniometry technique and magnifying optical system. Droplets of bidistilled water were dripped carefully on the coated templates. The volume of the droplets was 2-5 µl.

Scanning electron microscopy was performed for reliefs A and B coated with 360 Å gold films by a sputtering procedure in argon atmosphere. A thickness of coating was determined by time of sputtering.

Example 1

Figure 2B:
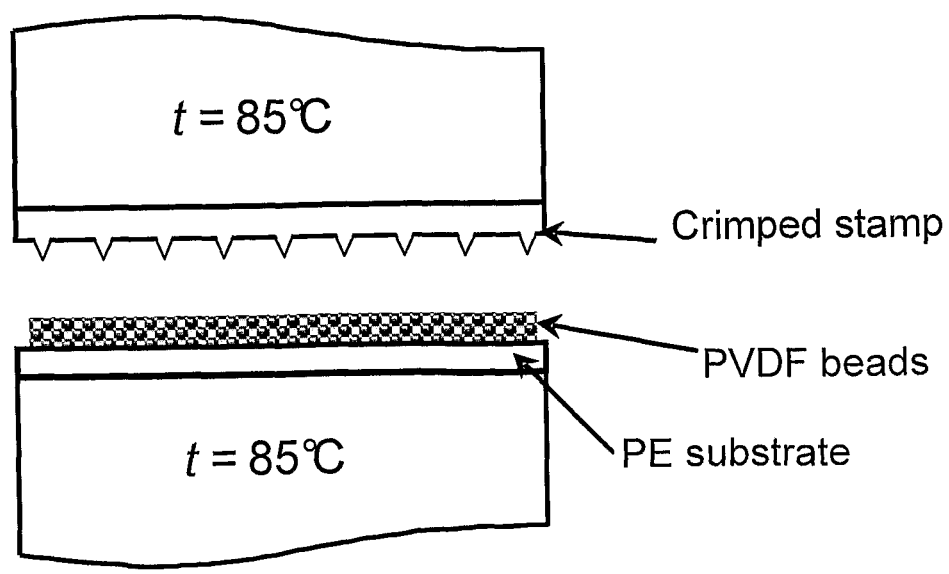

Highly hydrophobic polymer surfaces were obtained (FIG. 2a-b). Tilted base substrates were coated with chlorinated solvents-based solutions comprising polycarbonate and PVDF beads. Polycarbonate is soluble in the chlorinated solvents, whereas PVDF is not, thus a suspension was formed and dripped on the substrates as depicted in FIG. 2a, e.g. quartz glass substrate, and dried with a room temperature air current. The structure of the dry film studied by means of scanning electron microscopy (SEM) shows interconnected colloidal arrays (ICA), such as presented in FIG. 3a-b. These arrays are micro-scaled aggregates consisting of PVDF particles embedded in PC that filled the porosity between PVDF beads. The most frequent size of these aggregates was determined as 3-10 μm. The aggregates incorporate $10^4$-$10^6$ PVDF nanoparticles. The relief displayed in FIG. 3 is mentioned further as Relief A.

At the first stage solutions containing 2-5 wt % of PC dissolved in chloroform were prepared. Then particles of PVDF (2 wt %) were added under stirring (PVDF is insoluble in chlorinated solvents). Two types of substrates, quartz glass and polypropylene (PP), were coated, in a manner depicted in FIG. 2a. The slope of the substrate was α=19-22°.

Example 2

A layer of PVDF beads in powder form has been spread at the surface of the low density polyethylene (PE) substrate (see FIG. 2b). Then the sandwich has been exposed to hot pressing with a randomly riffled stamp. The PE has been softened under the pressing and traps single PVDF particles (which are still solid under the pressing temperature) and globular aggregates were formed comprising PVDF beads. The aggregates, composed of nano-scaled beads frozen in the PE matrix, formed highly developed interface photographed in FIG. 4a-b. This random pseudo-fractal surface is mentioned below as Relief B. Pressed stamp indentations form "channels" important for increasing the hydrophobicity. Hot pressing was carried out under t=85° C. The characteristic distance between indentations of the riffled stamp was 100 μm, the depth of the indentations was 20 μm.

Example 3

At the next stage, Reliefs A and B were coated with 360 Å gold films by a sputtering procedure in argon atmosphere. Then double distilled water droplets were dripped carefully on the coated templates. The volume of the droplets was 2-5 μl. Apparent contact angles are summarized in Table 1.

TABLE 1

ACA values of the textured surfaces

|  | Relief A | Gold coated relief A | Relief B | Gold coated relief B |
|---|---|---|---|---|
| Measured ACA | 95 ± 5° | 95 ± 5° | 160 ± 5° | 150 ± 5° |

While this invention has been described in terms of some specific examples, many modifications and variations are possible. It is therefore understood that within the scope of the appended claims, the invention may be realized otherwise than as specifically described.

The invention claimed is:

1. A method of manufacturing a hydrophobic surface having an apparent contact angle of at least 150°, the method comprising:
   i) providing a base substrate and a polymeric material;
   ii) forming a layer of said polymeric material on said substrate, said layer having a bottom surface attached to said substrate base, and an upper surface, wherein the polymeric material in said layer is structured at two different size scales, the first scale ranging from about 0.1 to 2 μm, and the second scale between 0.5-50 μm; and
   iii) further structuring said polymeric material at a third size scale by forming indentations on said upper surface, wherein an average distance between adjacent indentations is from 20 to 200 μm,
   wherein the hydrophobic surface having the three size scales is arranged in pseudoperiodic areas of higher and lower mass density, measured along a line going through the polymeric material and oscillating in a fractal-like manner; thereby obtaining a hydrophobic surface having an apparent contact angle of at least 150°.

* * * * *